United States Patent
Yamamoto et al.

(10) Patent No.: US 6,308,047 B1
(45) Date of Patent: Oct. 23, 2001

(54) RADIO-FREQUENCY INTEGRATED CIRCUIT FOR A RADIO-FREQUENCY WIRELESS TRANSMITTER-RECEIVER WITH REDUCED INFLUENCE BY RADIO-FREQUENCY POWER LEAKAGE

(75) Inventors: Kazuya Yamamoto; Kosei Maemura, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/243,467

(22) Filed: Feb. 3, 1999

Related U.S. Application Data

(63) Continuation of application No. PCT/JP96/02208, filed on Aug. 5, 1996.

(51) Int. Cl.$^7$ ........................................ H04B 1/44
(52) U.S. Cl. ........................... 455/73; 455/78; 455/252.1; 455/259
(58) Field of Search ................................. 455/257, 258, 455/259, 262, 252.1, 251.1, 73, 78, 80, 75

(56) References Cited

U.S. PATENT DOCUMENTS

| | | | |
|---|---|---|---|
| 3,872,325 | 3/1975 | Adams et al. | 307/251 |
| 4,408,347 | * 10/1983 | Ash | 455/179 |
| 5,633,610 | * 5/1997 | Maekawa et al. | 327/355 |
| 5,760,652 | * 6/1998 | Maemura et al. | 330/297 |
| 5,874,860 | * 2/1999 | Brunel et al. | 330/285 |
| 5,878,331 | * 3/1999 | Yamamoto et al. | 455/83 |

FOREIGN PATENT DOCUMENTS

| | | |
|---|---|---|
| 0599327 | 6/1994 | (EP). |
| 0700161 | 3/1996 | (EP). |
| 51-134084 | 11/1976 | (JP). |
| 55-91216 | 7/1980 | (JP). |

(List continued on next page.)

OTHER PUBLICATIONS

Yamamoto et al., "A GaAs RF Transceiver IC For 1.9 GHz Digital Mobile Communication System", ISSCC96/Session 21/Wireless Systems/Paper SP 21.1, 1996, pp. 340, 341, and 469.

*Primary Examiner*—Thanh Cong Le
*Assistant Examiner*—Thuan T. Nguyen
(74) *Attorney, Agent, or Firm*—Leydig,Voit & Mayer, Ltd.

(57) ABSTRACT

In an RF front end portion for processing a radio-frequency signal in a portable telephone, a low pass filter allowing passing of only a signal in a frequency band lower than a radio-frequency signal component band is arranged between a circuit processing a high power signal and a control circuit controlling operation of the radio-frequency signal processing circuit. The radio-frequency signal processing circuit is a transmission/reception multiplexing circuit transferring a transmission signal of the portable telephone to an antenna or receiving a reception signal from the antenna, and the control circuit is a transmission/reception control circuit determining an operation mode of the transmission/reception multiplexing switch. Alternatively, the radio-frequency signal processing circuit includes a power amplifier amplifying a signal to be transmitted, and a gate voltage control circuit generating gate bias voltage controlling a gain of the power amplifier. The influence of a radio-frequency leakage component leaking from a gate of the field effect transistor can be suppressed. In the case of the transmission/reception multiplexing switch, handing power can be improved, and an increase in power consumption and occupied area of the control circuit can be suppressed. In the case of the power amplifier, the gate bias voltage can be held stably, and the power amplification can be performed accurately. In the portable telephone, the RF front end portion processing the radio-frequency signal can be provided in a chip occupying a small area.

21 Claims, 9 Drawing Sheets

FOREIGN PATENT DOCUMENTS

| | | |
|---|---|---|
| 57-68055 | 4/1982 | (JP) . |
| 57-157607 | 9/1982 | (JP) . |
| 60-229415 | 11/1985 | (JP) . |
| 62-82751 | 4/1987 | (JP) . |
| 62-147931 | 9/1987 | (JP) . |
| 62-203406 | 9/1987 | (JP) . |
| 3192801 | 8/1991 | (JP) . |
| 3261205 | 11/1991 | (JP) . |
| 543622 | 6/1993 | (JP) . |
| 5199094 | 8/1993 | (JP) . |
| 637666 | 2/1994 | (JP) . |
| 6164249 | 6/1994 | (JP) . |
| 6188781 | 7/1994 | (JP) . |
| 774604 | 3/1995 | (JP) . |
| 7202585 | 8/1995 | (JP) . |
| 870245 | 3/1996 | (JP) . |

* cited by examiner $$\frac{fg}{100} \cdot Ra < \frac{1}{2\pi \cdot Ca} < \frac{fg}{5} \cdot Ra$$

$$fc = \frac{1}{2\pi\sqrt{LC}}$$

RADIO-FREQUENCY INTEGRATED CIRCUIT FOR A RADIO-FREQUENCY WIRELESS TRANSMITTER-RECEIVER WITH REDUCED INFLUENCE BY RADIO-FREQUENCY POWER LEAKAGE

REFERENCE TO RELATED APPLICATION

This Application is a continuation of International Application No. PCT/JP96/02208, having a international filing date of Aug. 5, 1996, the disclosure of which Application is incorporated by reference herein. The benefit of the filing and priority dates of the International Application is claimed.

BACKGROUND OF THE INVENTION

1. Field of the Invention

The present invention relates to a radio-frequency integrated circuit for processing radio-frequency signals, and in particular to a radio-frequency integrated circuit used in a radio-frequency transmitter-receiver such as a portable telephone. More particularly, the invention relates to a radio-frequency integrated circuit having a transmission/reception multiplexing switch and a control circuit for controlling transmission/reception modes of the multiplexing switch, which are arranged in an RF front end portion for transmitting and receiving radio-frequency signals in a portable telephone, or a radio-frequency integrated circuit including a power amplifier amplifying a radio-frequency signal and a circuit producing a bias voltage for controlling a gain of the power amplifier.

2. Description of the Background Art

Recently, the market for mobile communications has been growing owing to the widespread use of extremely compact portable telephones. The mobile communications system may use an analog modulation system in which carrier waves are analog-modulated with audio signals for transmission and reception, or may use a system in which audio signals are converted into digital data, and then digital modulation of carrier waves is performed for transmission. For improving portability of such compact portable telephones, efforts have been made to reduce the size, weight and thickness thereof. For implementation of these factors, it is extremely important to reduce chip sizes of components and to enhance a functional integration.

The compact portable telephone system uses carrier waves in a frequency band of the order of gigahertz (GHz), and in the RF front end portion for transmitting and receiving such radio-frequency signals, a GaAs IC chip including MESEFTs (Metal Semiconductor Field effect Transistors) formed of GaAs (gallium arsenide). Miniaturizing technology for GaAs has been less developed compared with silicon technology for forming MOS transistors. Therefore, integration of the GaAs IC chips have not been developed sufficiently, and of reduction in size through high integration of the components thereof have been strongly desired.

FIG. 1 schematically shows a whole structure of a portable telephone in the prior art. In FIG. 1, the portable telephone includes an RF front end portion which transmits and receives radio-frequency signals via an antenna ANT, and an audio processing circuit APC which receives a reception signal RX-OUT from the RF front end portion in a receiving operation, and performs predetermined processing on the reception signal to reproduce and apply audio signals to a speaker SPK. Audio processing circuit APC also operates, in a transmitting operation, to receive audio signals from a microphone MIC, and send the received audio signals to the RF front end portion after effecting processing, which is reverse to the processing in the receiving operation, on the audio signals. The portable telephone further includes a controller CTRL which controls operations of audio processing circuit APC and the RF front end portion.

Audio processing circuit APC includes an ADPCM codec which performs coding and decoding in accordance with, e.g., ADPCM (adaptive differential pulse code modulation) as well as circuitry for time-division multiplexing of transmission signals and reception signals. Controller CTRL controls the switching between the transmission mode and the reception mode in audio processing circuit APC, and also controls the time-division multiplexing of the transmission and reception signals and other processing. Controller CTRL produces control signal CONT, which in turn includes several kinds of signals and performs instruction of the transmission/reception modes as well as control of the levels of the transmission and reception signals and other processing in the RF front end portion.

The RF front end portion further includes an oscillator circuit OSC generating a signal of a constant frequency, e.g., of 1.66 GHz, a control logic CTL which generates a signal controlling the operation of the RF front end portion in accordance with control signal CONT transferred from controller CTRL, a mixer MIXt which mixes a coded audio signal transferred from audio processing circuit APC with an oscillating signal transferred from oscillator circuit OSC, a transmission attenuator TXATT which attenuates the signal transferred from transmission mixer MIXt in accordance with the control signal transferred from control logic CTL, a negative voltage generating circuit NVG which generates a negative voltage VG in accordance with a control voltage VNVG transferred from controller CTRL, a power amplifier PA which has a gain controlled by the negative voltage VG transferred from negative voltage generating circuit NVG used as a bias voltage, and performs power amplification of the signal transferred from transmission attenuator TXATT, and a bandpass filter (BPF) BFt allowing passage of signals in a predetermined band of the output signals of power amplifier PA.

Transmission mixer MIXt adds coded audio signal TX-IN transferred from audio processing circuit APC with the oscillating signal transferred from oscillator circuit OSC, to produce a radio-frequency signal suitable for transmission. Transmission attenuator TXATT reduces an amplitude of the signal transferred from mixer MIXt in accordance with a signal transferred from a radio-frequency signal intensity indicator (not shown) included in controller CTRL, and controls the level of the transmission signal.

Power amplifier PA, which will be described later in more detail, includes MESFETs as its components, and receives negative voltage VG as a bias voltage for controlling the gain for operating MESFETs in a reverse bias state with the gate to source. Owing to power amplifier PA, the transmission signal is transferred via antenna ANT with a large power. The carrier wave of the transmission signal transferred from power amplifier PA is in a frequency band of about 1.9 GHz, and the transmission bandpass filter BFt allows passage of the signal in this band.

The RF front end portion further includes a transmission/reception multiplexing switch SW which multiplexes the transmission mode and the reception mode under the control of control logic CTL. Transmission/reception multiplexing switch SW includes a transmission signal input node Wt receiving the transmission signal from the transmission bandpass filter BFt, a transmission/reception node Wa coupled to antenna ANT, and a reception signal output node Wr. Transmission/reception node Wa is coupled electrically and selectively to one of transmission signal input node Wt and reception signal output node Wr under the control of control logic CTL.

In the portable telephone shown in FIG. 1, the transmission signal and the reception signal are in the same frequency band of approximately 1.9 GHz, and transmission and reception are switched with this transmission/reception multiplexing switch SW. As already described, audio processing circuit APC transmits and receives the transmission signal and reception signal in a time division manner and, in accordance with this time division operation, control logic CTL sets transmission/reception multiplexing switch SW to one of the transmission mode, reception mode and standby mode.

The RF front end portion further includes a reception attenuator RXATT which attenuates the reception signal transferred from reception signal output node Wr of transmission/reception multiplexing switch SW under the control of control logic CTL, a reception bandpass filter (BPF) BFr which allows passage of signals in a predetermined frequency band of the output signals of reception attenuator RXATT, a low noise amplifier LNA which amplifies the output signal of reception bandpass filter BFr, and a reception mixer MIXr which mixes the output signal of low noise amplifier LNA with the oscillating signal from oscillator circuit OSC, and converts the radio-frequency signal into a signal in a frequency band suitable to processing of audio processing circuit APC.

Similarly to transmission attenuator TXATT, the degree of attenuation of reception attenuator RXATT is controlled by control logic CTL based on the reception signal level monitored by a personal user or control logic CTL. Reception bandpass filter BFr allows passage of signals in the frequency band of the carrier wave. Low noise amplifier LNA includes MESFETs as its components, and amplifies weak reception signals. Reception mixer MIXr subtracts the oscillating signal of oscillator circuit OSC from the output signal of low noise amplifier LNA, and produces a reception signal (received coded audio signal) RX-OUT in the frequency band suitable to processing in audio processing circuit APC.

FIG. 2 shows a structure of the integrated circuit of the RF front end portion shown in FIG. 1. The structure of the RF front end IC shown in FIG. 2 is disclosed in "GaAs RF transceiver IC for 1.9 GHz Digital Mobile Communication Systems", Digest of Technical Papers, 1996 ISSCC, Yamamoto et al, Feb. 10, 1996, pp. 340–341.

In FIG. 2, the RF front end IC includes all the components included in the RF front end portion shown in FIG. 1 except for bandpass filters BFt and BFr as well as antenna ANT. Mixers MIXt and MIXr as well as oscillating circuit OSC, which are not shown in FIG. 2, are formed in a GaAs chip or Si chip, and the chip used for them can now be selected differently. Bandpass filters BFt and BFr are arranged outside IC (chip) RFFP for accurately passing the signals in a required band, and are formed of discrete parts, and are connected to chip RFFP via terminals TX-OUT and SW-TX and terminals SW-RX and RX-TV, respectively. Thereby, the chip size of RF front end IC RFFP, and therefore the cost thereof are intended to be reduced.

Power amplifier PA includes power amplifier circuits PAa–PAc in three stages. Gains of power amplifier circuits PAa–PAc are controlled in accordance with bias voltage VG generated by negative voltage generating circuit NVG.

A negative voltage VSS applied from negative voltage generating circuit NVG to control logic CTL is used for controlling on/off switching of transistors included in transmission/receipt multiplexing switch SW. The structure for this control will be described later.

This RF front end IC is formed of a single GaAs chip. Transmission bandpass filter BFt is connected between transmission signal ports SW-TX and TX-OUT, and reception bandpass filter BFr is connected between reception ports SW-RX and RX-IN. Transmission/reception multiplexing switch SW is coupled to antenna ANT via a transmission/reception port WAP coupled to antenna ANT. Further, ports TX-IN and RX-OUT for signal reception and transmission from and to audio processing circuit APC (see FIG. 1) as well as signal input terminals VNVG and CONT for receiving control signals are arranged.

The circuit elements included in RF front end IC RFFP shown in FIG. 2 include, as components, MESFETs formed on a GaAs substrate.

FIG. 3 shows by way of example structures of transmission/reception multiplexing switch SW and control logic CTL shown in FIG. 2. More specifically, FIG. 3 shows structures of a transmission switch SWa of transmission/reception multiplexing switch SW and an output stage CTLa controlling transmission switch SWa in control logic CTL. In the reference described previously, transmission switch SWa includes two switching transistors connected in series, but FIG. 3 shows only one of the switching transistors for simplicity.

In FIG. 3, transmission switch SWa includes a depletion type MESFET (Metal-Semiconductor Field effect Transistor) J10, which in turn will be referred to as a "D-MES transistor" hereinafter. D-MES transistor J10 is connected between transmission signal input node Wt and transmission/reception node Wa, and receives on its control electrode (gate) a control voltage Vc through a resistance element R10. Transmission switch SWa further includes a resistance element r10, which in turn is connected between the source and drain of D-MES transistor J10 and exhibits a high impedance in an AC (alternating current) manner. Resistance element R10 makes a connection between the source and drain of D-MES transistor J10 in a DC (direct current) manner, and holds the source and drain thereof at the same potential in the DC manner. Resistance element R10 functions as a load resistance which suppresses a current flowing through the gate of D-MES transistor J10, and also has a function of reducing an AC component.

Transmission/reception multiplexing switch SW includes a reception switch SWb arranged between transmission/reception node Wa and reception signal output node Wr. Reception switch SWb likewise includes MESFETs as its components. In the foregoing prior art reference, the MESFET included in reception switch SWb receives a control voltage changing between a positive power supply voltage Vdd and a negative voltage Vss applied from negative voltage generating circuit NVG on its gate as a control signal, but a path for this control signal is not shown in detail (only a path SL2 is shown).

Control voltage output stage CTLa of control logic CTL includes an enhancement-type MESFET EI, which will be referred to as an "E-MES transistor" hereinafter. Enhancement-type MESFET EI is connected between a power supply node Vdd (the node and the voltage applied thereto are indicated by the same characters) and output node Vo, and receives on its gate a control signal φ. The control voltage output stage also includes an E-MES transistor E2 which is connected between output node Vo and a ground node gnd, and receives on its gate a control signal /φ. Control signals φ and /φ are signals complementary with each other.

In the transmission mode, control signal φ is at H-level, and control signal /φ is at L-level. E-MES transistor E1 is on, and E-MES transistor E2 is off so that control voltage Vc at the level of power supply voltage Vdd is applied to the gate of D-MES transistor J10 via signal line SL1 and resistance element R10. Thereby, D-MES transistor J10 is turned on so that transmission signal TX applied to transmission signal input node Wt is transferred to transmission/reception node Wa, and then is transferred to antenna ANT for transmission therefrom.

During standby or reception mode, control signal φ is at L-level, and control signal /φ is at H-level. Control voltage Vc is at the level of ground voltage gnd so that D-MES transistor J10 is turned off, and transmission signal input node Wt is isolated from transmission/reception node Wa in AC manner.

In the MESFET, the gate and the substrate region (channel region) are isolated from each other by a Schottky junction. In this structure, the source/drain is coupled to the gate in the AC manner through the junction capacitance, and a radio-frequency component leaks (i.e., a radio-frequency current flows) to the gate region of the E-MES transistor. Resistance element R10 restrains this radio-frequency component. In the portable telephones, however, signals of large powers flow between ports Wt and Wa. For example, a signal of about 22 dBm flows in a PHS (personal handyphone system), and signal of about 30 dBm flows in a PDC (personal digital cellular) system. Due to such large powers, a radio-frequency component S1 leaks through the gate of D-MES transistor J10 and resistance element R10.

If the output impedance provided by E-MES transistors E1 and E2 of control voltage output stage is not sufficiently small, reflection of the radio-frequency component occurs, and control voltage Vc varies in accordance with the radio-frequency leakage component S1 so that the gate potential of D-MES transistor J10 of transmission switch SWa oscillates, and on/off switching thereof cannot be accurately controlled. Accordingly, the withstand power characteristics (handling power) of transmission/reception multiplexing switch SW is lowered, and large power signals cannot be transmitted accurately.

The radio-frequency component also leaks through the MESFET included in reception switch SWb connected to port Wa. A radio-frequency component S2 flows through signal line SL2 to the control voltage generating portion of reception switch SWb, and on/off of reception switch SWb cannot be controlled accurately.

For sufficiently reducing the output impedance of output stage CTLa, MESFETs having a large gate width of 50–100 μm or greater must be used as E-MES transistors E1 and E2. In this case, an area occupied by output stage CTLa increases, which impedes high-density integration. If E-MES transistors E1 and E2 have a large gate width, current driving capabilities thereof must be increased for fast driving of gate capacitances thereof. For increasing such driving capabilities, it is necessary to increase the gate width of other MESFETs producing control signals φ and /φ, which results in an increase in area occupied by control logic CTL as well as increase in current consumption.

Usually, for the portable telephone including transmission/reception multiplexing switch SW, a TDMA (time-division multiple access) technology is used. Since multiple channels are allocated to the same carrier wave frequency, audio data is divided into slots, which are successively transferred or received with times shifted from each other so that conflict with another channel may be prevented. In PHS system, carrier waves in the same frequency band (1.9 GHz) are used for transmission and reception. For this transmission and reception, a TDD (time-division duplex) system is employed for switching in a time-division manner. In this case, however, transmission/reception multiplexing switch SW must be switched between the transmission and reception at a high speed such as several nanoseconds to hundreds of nanoseconds, and therefore E-MES transistors E1 and E2 rapidly perform the switching operation. For the fast switching operation of E-MES transistors E1 and E2 having large gate widths, the circuit generating control signals φ and /φ must rapidly change control signals φ and /φ with a large current driving capability. Accordingly, current consumption increases in the circuit portion for generating control signals φ and /φ.

Such increase in current consumption is not preferable in portable telephones and other apparatus which operate with batteries used as an operational power supply.

FIG. 4 shows an appearance of an assembly of the RF front end portion of the portable telephone shown in FIG. 1. In FIG. 4, control logic CTL and transmission/reception multiplexing switch SW are formed on different GaAs chips, respectively. Control logic CTL and transmission/reception multiplexing switch SW which are formed on the different chips, respectively, are mounted on a board and are mutually connected. In FIG. 4, transmission/reception multiplexing switch SW is arranged on a die pad DP. Around transmission/reception multiplexing switch SW, there are arranged a pad Wtp forming transmission signal input node Wt, a pad Wap forming transmission/reception node Wa, a pad Wrp forming a reception signal output node, and pads Vct and Vcr forming control voltage input nodes. These pads Wtp, Wap, Wrp, Vct and Vcr are connected to leads Le1–Le5 through bonding wires b1–b5, respectively. Transmission/reception multiplexing switch SW and die pad DP as well as portions of leads Le1–Le5 are sealed in a package SWP. Leads Le1–Le5 form external terminals for transmitting or receiving signals to or from other chips.

Bonding wires b1–b5 have widths much larger than those of signal transmission lines included in transmission/reception multiplexing switch SW. Pads Wtp, Wap, Wrp, Vct and Vcr have sufficiently large widths. Leads Le1–Le5 have sufficiently large widths for forming the external terminals. Therefore, these pads, bonding wires and leads provide a large parasitic inductance L as represented by broken line in FIG. 4. In a radio-frequency band of, e.g., 1 GHz, inductance component L prevents external leakage of the radio-frequency signals ($Z=2\cdot\pi\cdot f\cdot L$, where f is a frequency).

Accordingly, in the structure including transmission/reception multiplexing switch SW and control logic CTL formed in the different chips, respectively, as shown in FIG. 4, no problem substantially occurs even if the radio-frequency component leaks. However, in the structure including the RF front end portion integrated in the single GaAs chip as shown in FIG. 2, the pads, bonding wires and leads shown in FIG. 4 are not present so that the radio-frequency component is not restrained, resulting in a problem that the control voltage becomes instable.

In the structure shown in FIG. 3, high inductance elements can be arranged at control signal (voltage) transmission lines SL1 and SL2. In this case, however, the chip area increases because the inductance elements including coils occupy a large area.

FIG. 5 schematically shows a connection between power amplifier PA and negative voltage generating circuit NVG shown in FIGS. 1 and 2. More specifically, FIG. 5 shows structures of a power amplifier circuit PAi in one stage and a gate voltage control circuit GVC which generates a gate voltage Vg controlling a gain of power amplifier circuit PAi.

In FIG. 5, power amplifier circuit PAi includes a D-MES transistor J11 which receives on its gate a radio-frequency signal (transmission signal) TXi through a capacitance element Cc, and amplifies the same for applying the amplified signal to a power amplifier circuit in the next stage or an output stage, and a resistance element R11 and a capacitance element C11 which are connected in series between the gate of D-MES transistor J11 and ground node gnd. Capacitance element Cc has a function of cutting off a DC component. Capacitance element C11 is turned on in the operation frequency band of input signal TXi, to electrically connect an end of resistance element R11 to ground node gnd. Control voltage Vg is applied to a connection between resistance element R11 and capacitance element C11. Resistance element R11 biases the gate potential of E-MES transistor J11 in accordance with control voltage Vg, and determines the operation point of D-MES transistor J11 for controlling the gain of power amplifier circuit PAi.

Gate voltage control circuit GVC of negative voltage generating circuit NVG includes an E-MES transistor E3 which receives on its gate a constant negative voltage V1, and produces control voltage Vg on an output node OUT, and a load resistance RL which is connected between output node OUT and negative voltage node VSS. E-MES transistor E3 operates in a source follower mode, and holds output node OUT at a constant potential level of (V1−Vth), where Vth represents a threshold voltage of E-MES transistor E3. Load resistance RL has a function of pulling down the potential on output node OUT.

In power amplifier circuit PAi, capacitance element C11 is in a short-circuited state in the AC manner, and electrically couples resistance element R11 to ground node gnd in the frequency band of input signal TXi. Capacitance element C11 isolates resistance element R11 from ground node gnd in the DC manner, and resistance element R11 is supplied with control voltage Vg on its one end. Gate control voltage Vg lowers the gate voltage of D-MES transistor J11, and lowers the gain. Thereby, oscillation of the three cascaded stages of power amplifier circuits is prevented.

However, if capacitance element C11 does not short-circuit all the signals to ground node gnd in the frequency band of input radio-frequency signal TXi, a radio-frequency component S3 of radio-frequency signal TXi supplied during operation of power amplifier circuit PAi or the signal amplified by transistor J11 is transmitted to gate voltage control circuit GVC via a signal line G1. Radio-frequency leakage component S3 is an AC signal. In gate voltage control circuit GVC, circuit impedance accompanying gate voltage control circuit GVC differs for positive and negative components of radio-frequency leakage component S3 (see the foregoing reference by Yamamoto et al.). Therefore, the voltage level of control voltage Vg may vary from the desired value. This is because the radio-frequency leakage component S3 is rectified so that performance of gate voltage control circuit GVC for holding a stable voltage in the DC manner is lowered.

The radio-frequency leakage component is restrained by the parasitic inductance component of the bonding wires, pads and leads, if power amplifier circuit PAi and negative voltage generating circuit NVG are formed in the different chips, respectively, as shown in FIG. 4. However, the structure wherein the RF front end portion is integrated in the single chip as shown in FIG. 2 suffers from a problem similar to the foregoing problem caused by the transmission/reception multiplexing switch and the control logic.

SUMMARY OF THE INVENTION

Accordingly, an object of the invention is to provide a radio-frequency integrated circuit which can operate stably even if leakage of a radio-frequency power occurs.

Another object of the invention is to provide a radio-frequency integrated circuit with a transmission/reception multiplexing switch which operates stably.

Still another object of the invention is to provide a radio-frequency integrated circuit with a power amplifier which stably amplifies a radio-frequency input signal.

Yet another object of the invention is to provide a radio-frequency integrated circuit implementing a portable telephone which operates stably with a low power consumption and a low current consumption.

The invention provides a radio-frequency integrated circuit including a field effect transistor receiving a radio-frequency input signal and transferring a signal corresponding to the radio-frequency input signal and a control voltage generating circuit applying an operation control voltage to a gate of the field effect transistor through a path other than a transmission path of the radio-frequency input signal are integrated on the same substrate, characterized in that a low pass filter is arranged in the control voltage transmission path extending from the control voltage generating circuit.

Preferably, the radio-frequency circuit is a transmission/reception multiplexing switch having a transmission mode for transferring a radio-frequency transmission signal applied to a transmission signal input node to a transmission/reception node coupled to an antenna via a first field effect transistor, and a reception mode for transferring a radio-frequency reception signal applied to the transmission/reception node to a reception signal output node via a second field effect transistor, and operating in the operation mode determined by driving the first and second field effect transistors to the on/off state by the control voltage applied from the control voltage generating circuit.

Alternatively, the radio-frequency circuit can be a power amplifier amplifying the radio-frequency input signal by a field effect transistor, wherein the control voltage generated by the control voltage generating circuit determines a gate voltage of the field effect transistor for determining a gain of the power amplifier.

Owing to provision of the low pass filter at the control voltage transmission path, the low pass filter can absorb a radio-frequency leakage component of the radio-frequency signal of a high power, which may leaks from the radio-frequency circuit through the field effect transistor into the control signal transmission path. Therefore, the control voltage can be stably held at the constant level, and the stable operation can be ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 6:
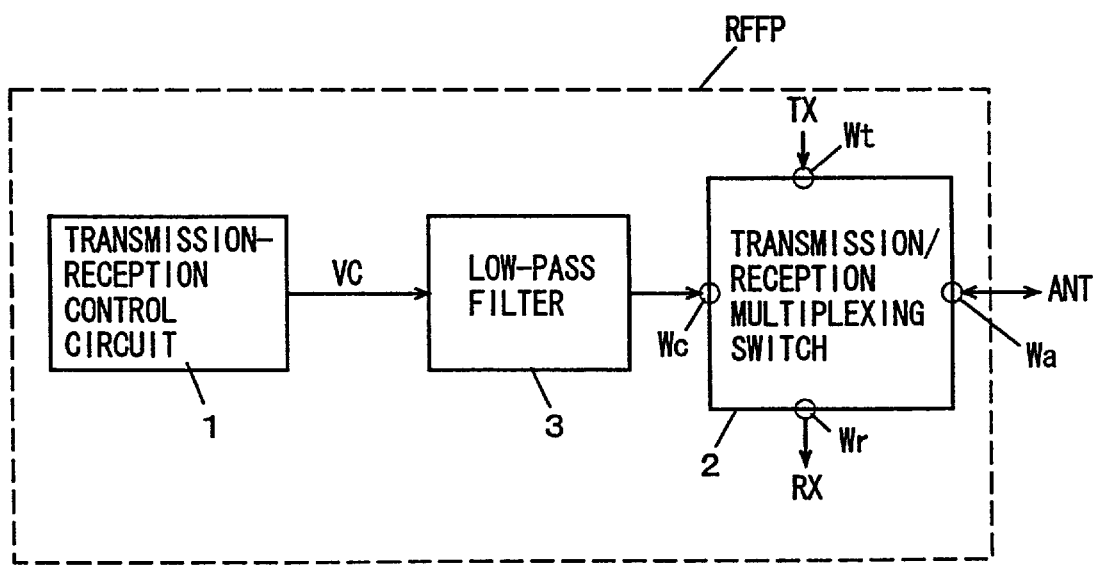
FIG. 6 schematically shows a structure of an embodiment 1 of the invention.

FIG. 6 schematically shows a structure of a radio-frequency integrated circuit of an embodiment 1 of the invention. In FIG. 6, an RF front end integrated circuit (chip) RFFP includes a transmission/reception control circuit 1 which produces a control voltage VC designating an operation mode, i.e., one of a transmission mode, a reception mode and a standby mode; a transmission/reception multiplexing switch 2 provided corresponding to a radio-frequency circuit and operating in the transmission/reception or standby mode in accordance with control voltage VC transferred from transmission/reception control circuit 1, and a low pass filter 3 provided at a signal line transmitting control voltage VC between transmission/reception control circuit 1 and transmission/reception multiplexing switch 2.

Figure 1:
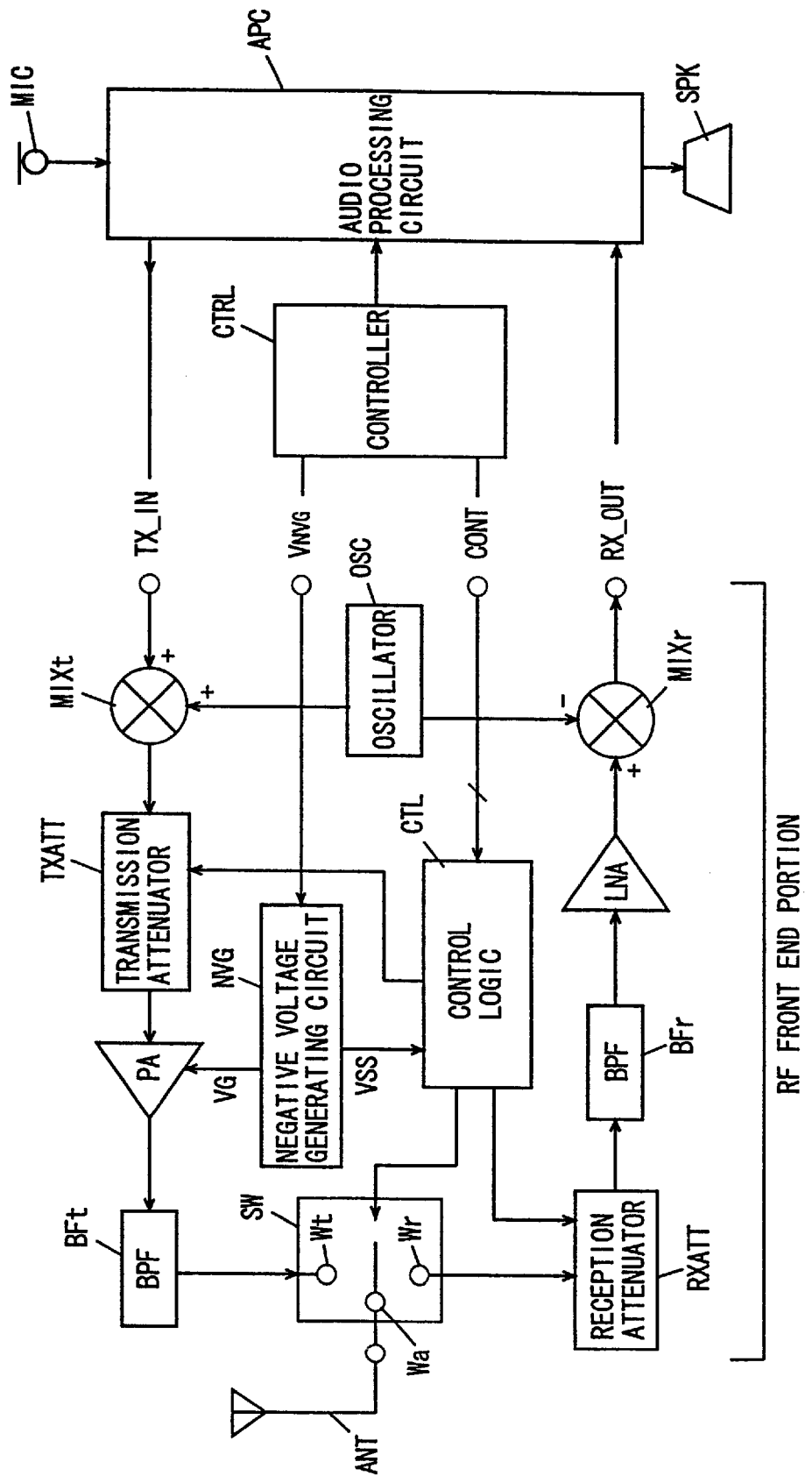
FIG. 1 is a diagram schematically showing a construction of a conventional portable telephone.
Figure 2:
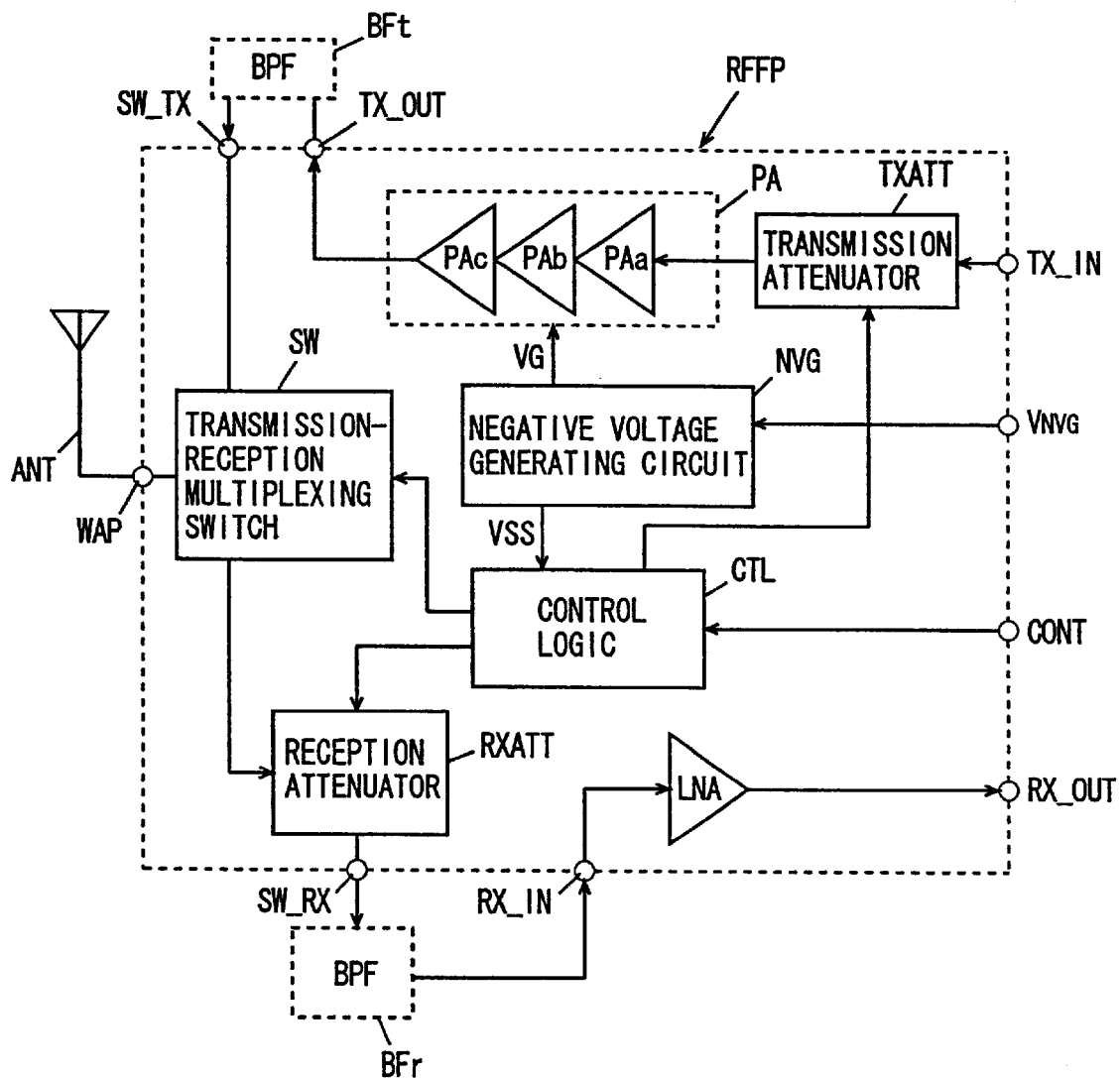
FIG. 2 schematically shows a structure, including an RF front end portion shown in FIG. 1, integrated in a single chip.
Figure 3:
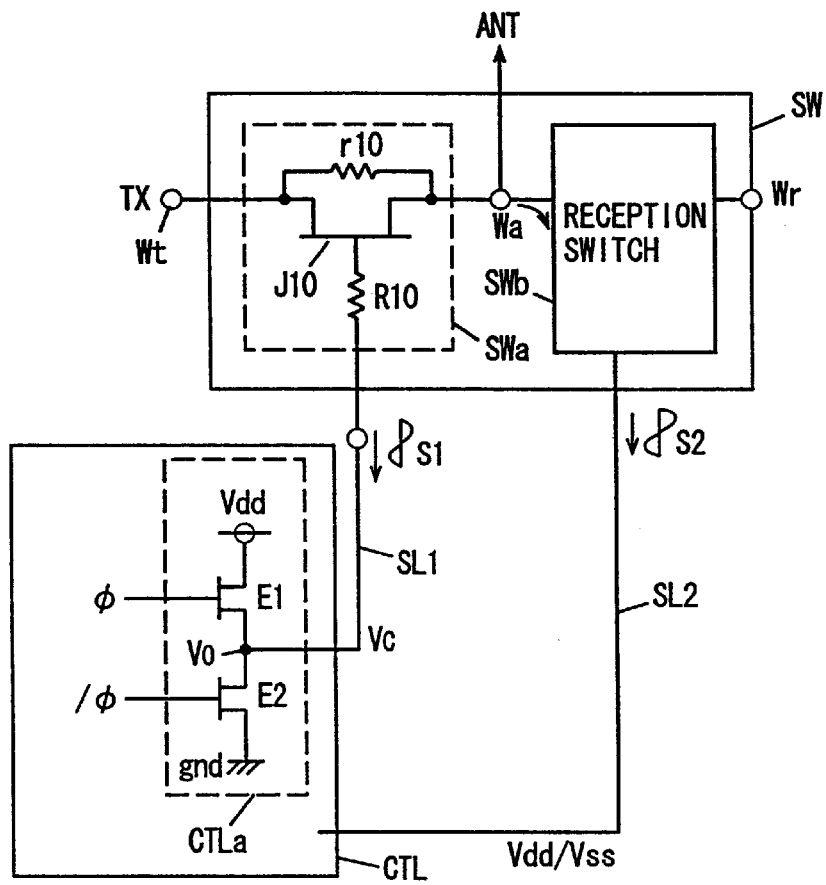
FIG. 3 schematically shows structures of a transmission/reception multiplexing switch and a transmission/reception multiplexing portion thereof shown in FIGS. 1 and 2.
Figure 4:
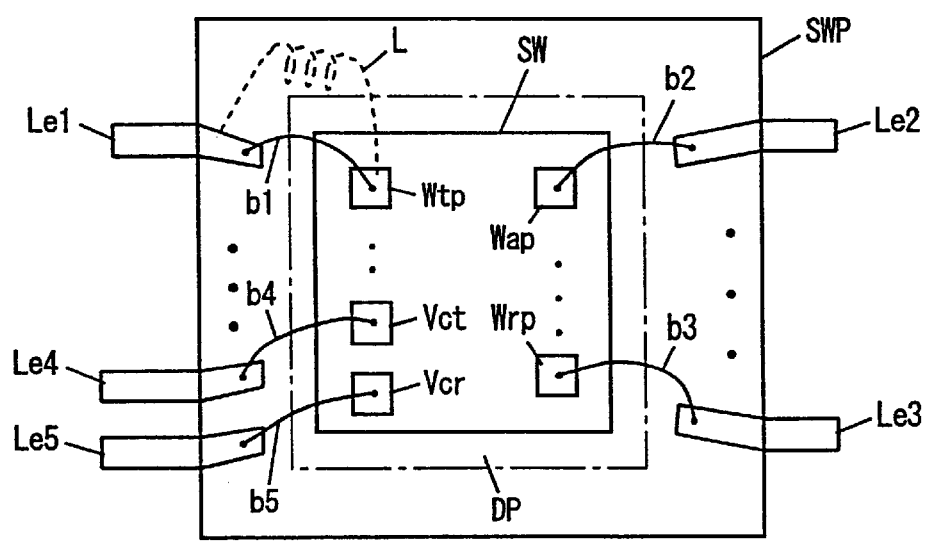
FIG. 4 schematically shows an assembly of the transmission/reception multiplexing switch in the prior art.

Transmission/reception control circuit 1 is included in control logic CTL shown in FIGS. 1 and 2, and produces control voltage VC at a required voltage level in accordance with an operation mode instructing signal transferred from controller CTRL shown in FIG. 1.

Transmission/reception multiplexing switch 2 includes transmission signal input node Wt receiving radio-frequency transmission signal TX, transmission/reception node Wa coupled to antenna ANT, reception signal output node Wr outputting a radio-frequency reception signal, and a control voltage input node Wc receiving control voltage VC.

Low pass filter 3 cuts off a radio-frequency leakage component flowing from transmission/reception multiplexing switch 2 to transmission/reception control circuit 1. Transmission/reception multiplexing switch 2 applies transmission signal TX, which is applied to transmission signal input node Wt, to transmission/reception node Wa when the transmission mode is designated in accordance with the voltage level of control voltage VC. In the reception mode, the transmission/reception multiplexing switch 2 outputs the radio-frequency reception signal, which is applied to transmission/reception node Wa, through reception signal output node Wr. A reception signal RX transferred from transmission/reception multiplexing switch 2 is applied to reception attenuator RXATT shown in FIG. 2.

As shown in FIG. 6, low pass filter 3 is arranged at a signal line transmitting control voltage VC from transmission/reception control circuit 1, whereby a radio-frequency component, which may leak when transmission/reception multiplexing switch 2 sends the transmission signal having a high power, can be prevented from reaching transmission/reception control circuit 1. Therefore, control voltage VC at the constant voltage level can be stably applied to transmission/reception multiplexing switch 2.

Figure 7:
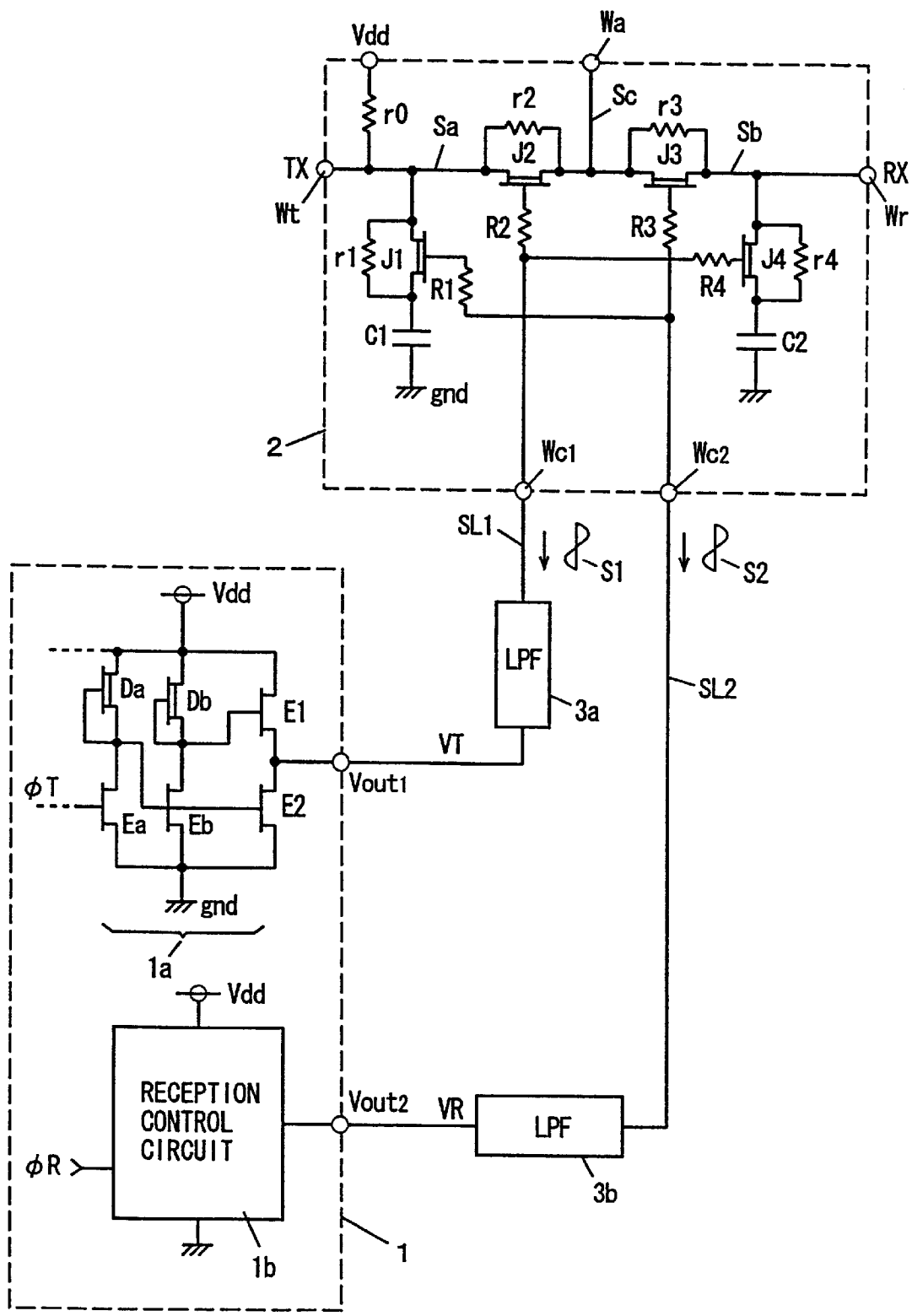
FIG. 7 shows a specific structure according to an embodiment 1 of the invention.

FIG. 7 shows specific structures of transmission/reception control circuit 1 and transmission/reception multiplexing switch 2 shown in FIG. 6. In FIG. 7, transmission/reception control circuit 1 includes a transmission control circuit 1a which produces reception control voltage VT for activating/deactivating the transmission mode in accordance with a transmission mode instructing signal $\phi T$, and a reception control circuit 1b which produces reception control voltage VR in response to a reception mode instructing signal $\phi R$. Transmission control circuit 3a and reception control circuit 1b have similar structures, and therefore FIG. 7 shows only the structure of transmission control circuit 1a.

Transmission control circuit 1a includes a D-MES transistor (i.e., depletion-type MES transistor) Da which has one conduction node i.e., non-control node, connected to power supply node Vdd (the node and the voltage applied thereto are indicated by the same characters), and a gate connected to the other conduction node, an E-MES transistor Ea which has one conduction node connected to D-MES transistor Da and the other conduction node connected to ground node gnd, and receives transmission mode instructing signal $\phi T$ on its gate, a D-MES transistor Db which has one conduction node connected to power supply node Vdd and a gate connected to the other conduction node, an E-MES transistor Eb which is connected between D-MES transistor Db and ground node gnd and has a gate connected to the gate of D-MES transistor Da and the other conduction node thereof, an E-MES transistor E1 which is connected between power supply node Vdd and output node Vout1 and has a gate connected to the gate of D-MES transistor Db, and an E-MES transistor E2 which is connected between output node Vout1 and ground node gnd and has a gate connected to the gate of D-MES transistor Da and the other conduction node thereof.

Power supply voltage Vdd is about 3 V. D-MES transistors Da and Db operate as load elements, and these transistors Da and Db and E-MES transistors Ea and Eb form two cascaded inverters.

When transmission mode instructing signal $\phi T$ is at H-level, E-MES transistor Ea is on, and the gate and the other conduction node of D-MES transistor Da are at the level of ground potential gnd so that E-MES transistor Eb is off. Thereby, E-MES transistor E1 receives on its gate the signal at H-level and is turned on, and E-MES transistor E2 receives on its gate the signal at L-level and is turned off. In this state, control voltage VT transferred from output node OUT1 is at H-level of power supply voltage Vdd.

When transmission mode instructing signal $\phi T$ is at L-level, E-MES transistor E1 is off and E-MES transistor E2 is on, so that control voltage VT is at L-level of ground potential gnd.

In reception control circuit 1b, when reception mode instructing signal φR is active (H-level), control voltage VR transferred from output node Vout is at H-level of power supply potential Vdd. When reception mode instructing signal φR is inactive (L-level), control voltage VR is at L-level of ground potential gnd.

In the communication mode, switching between these operation mode instructing signals φT and φR is performed at high speed in a time-division manner. In the standby mode, these operation mode instructing signals φT and φR are inactive.

Transmission/reception multiplexing switch 2 includes a D-MES transistor J2 which is connected between transmission signal input node Wt and transmission/reception node Wa and receives, on its gate, transmission control voltage VT from transmission control circuit 1a through resistance element R2, a D-MES transistor J1 which is connected between ground node gnd and a signal line Sa coupled to transmission signal input node Wt and receives, on its gate, reception control voltage VR from reception control circuit 1b through resistance element R1, a D-MES transistor J3 which is connected between transmission/reception node Wa and reception signal output node Wr and receives, on its gate, control voltage VR from reception control circuit 1b through resistance element R3, and a D-MES transistor J4 which is connected between reception signal output node Wr and ground node gnd and receives, on its gate, control voltage VT from transmission control circuit 3a through resistance element R4.

A signal line Sb is arranged between D-MES transistor J3 and reception signal output node Wr, and a signal line Sc is arranged between transmission/reception node Wa and D-MES transistors J2 and J3.

Transmission/reception multiplexing switch 2 includes a resistance element r0 connected between signal line Sa and power supply node Vdd, a resistance element r1 for connecting the source and the drain of D-MES transistor J1 in the DC manner, a capacitance element C1 connected between resistance element r1 and D-MES transistor J1, and ground node gnd, a resistance element r2 connected between the source and drain of D-MES transistor J2, a resistance element r3 connected between the source and drain of D-MES transistor J3, a resistance element r4 connected between the source and drain of D-MES transistor J4, and a capacitance element C2 connected between resistance element r4 and D-MES transistor J4, and the ground node gnd.

Transmission signal TX and reception signal RX are transmitted through transmission lines having a characteristic impedance of about 50 Ω. Resistance elements r0–r4 have resistance values of the order of kilo-ohms, and provide isolation in the AC manner between the sources and drains of D-MES transistors J1–J4 respectively in the frequency band of transmission signal TX and reception signal RX. Signal line Sa is coupled to power supply potential Vdd via resistance element r0, and therefore signal lines Sb and Sc are pulled up to the level of power supply potential Vdd owing to coupling in the DC manner by resistance elements r2 and r3. Likewise, the sources and the drains of D-MES transistors J1 and J4 are coupled in the DC manner by resistance elements r1 and r4, respectively, and are pulled up to the level of power supply potential Vdd.

Resistance elements R1–R4 likewise have resistance values of the order of kilo-ohms, and suppress leakage of radio-frequency components during transmission and reception of the radio-frequency signal.

Capacitance elements C1 and C2 are conductive in the frequency band of the transmission signal and reception signal, and thereby prevent interference between the transmission signal and the reception signal.

Low pass filter 3 includes low pass filters (LPFs) 3a and 3b, which are arranged between output nodes Vout1 and Vout2 of transmission/reception control circuit 1 and control voltage input nodes Wc1 and Wc2 of transmission/reception selector switch 2, respectively. Now, operation of transmission/reception selector switch 2 shown in FIG. 7 will be described below.

In the standby mode, control voltages VT and VR applied to nodes Wc1 and Wc2 are at L-level of ground potential gnd. In this state, D-MES transistors J1–J4 are off. More specifically, all signal lines Sa, Sb and Sc are pulled up to the level of power supply potential Vdd owing to resistance element r0, and the sources and drains of D-MES transistors J1 and J4 are held at the level of power supply potential Vdd by resistance elements r1 and r4, respectively. In each of D-MES transistors J1–J4, therefore, a deep reverse bias state is established between the gate and the source, and even the depletion mode transistors are reliably turned off by the control voltages VT and VR at the ground potential level.

In the transmission mode, control voltage VT is at H-level of power supply potential Vdd, and reception control voltage VR maintains the level of ground potential gnd. In this state, D-MES transistors J2 and J4 are on, and D-MES transistors J1 and J3 are off. Owing to the on state of D-MES transistor J4, a radio-frequency component which leaks through D-MES transistor J3 and appears on signal line Sb is discharged to ground node gnd so that the transmission signal is prevented from being transmitted through reception signal output node Wr.

Resistance element r1 cuts off transmission signal TX by its relatively large resistance value, and prevents transmission signal TX, which appears on signal line Sa, from being discharged to ground node gnd through capacitance element C1.

The transmission signal TX is a high power signal amplified by the power amplifier. Due to the high power of transmission signal TX, a radio-frequency component may leak to the gate of D-MES transistor J2 through a junction capacitance, and may not be absorbed by resistance element R2. Even in this case, radio-frequency component S1 is blocked by low pass filter (LPF) 3a, and control voltage VT is stably held at the constant voltage level by E-MES transistors E1 and E2. (The radio-frequency leakage component itself changes the potentials on the gate and source of a transistor in the same direction, and does not significantly affect the switching characteristics.) Thereby, the transmission can be performed stably even in the high power operation, and the withstand power characteristics (i.e., handling power) is improved.

Leakage of the radio-frequency component due to transmission signal TX of the high power may also occur at the junction capacitance of the gate of D-MES transistor J1, and may not be absorbed by resistance element R1. Even in this case, low pass filter (LPF) 3b provided at signal line SL2 prevents radio-frequency leakage component S2 from affecting control voltage VR transferred from reception control circuit 1b so that control voltage VR is reliably held at the ground potential level, and D-MES transistors J3 and MES transistor J1 are maintained off.

When radio-frequency transmission signal TX is transferred to signal line Sc, a radio-frequency component thereof may leak through the gate of D-MES transistor J3, and may not be absorbed by resistance element R3. Even in this case, low pass filter 3b blocks the radio-frequency leakage component. Further, the radio-frequency component may leak to signal line Sb through D-MES transistor J3 (the radio-frequency component is restrained by resistance element r3), and the radio-frequency leakage component on signal line Sb may be transferred to signal line SL1 through the gate of D-MES transistor J4 and resistance element R4. Even in this case, low pass filter 3a blocks the radio-frequency leakage component. In FIG. 7, the combined components on signal lines SL1 and SL2 formed of the radio-frequency leakage components transferred through these D-MES transistors are indicated by characters S1 and S2, respectively.

MESFET must operate with the gate to source/drain kept in a reverse bias state. Resistance elements r1–r4 and R1–R4 have functions of cutting off the radio-frequency components as well as functions of operating D-MES transistors J1–J4 each with the gate to source/drain junction kept in a reverse biased state.

In the transmitting operation, radio-frequency components S1 and S2 may leak to control voltage transmission lines SL1 and SL2 due to radio-frequency transmission signal TX of a high power. Even in this case, low pass filters 3a and 3b absorb radio-frequency leakage components S1 and S2, respectively. Therefore, it is not required to increase the gate widths of E-MES transistors E1 and E2 at the output stages of control circuits 1a and 1b. Accordingly, it is possible to reduce the current driving capabilities and therefore the gate widths of MES transistors Da, Db, Ea and Eb controlling on/off of E-MES transistors E1 and E2 so that the current consumptions and occupying areas of control circuits 1a and 1b can be reduced. Consequently, an area occupied by transmission/reception control circuit 1 can be reduced. Accordingly, transmission/reception multiplexing switch 2 and transmission/reception control circuit 1 can be integrated on a single chip without increasing the chip area.

Owing to employment of the MESFETs in the depletion mode, the on-state thereof can be made deeper as compared to MESFETs in the enhancement mode so that the radio-frequency signal can be efficiently transmitted without a signal loss.

In the reception mode, control voltage VT is at L-level, and control voltage VR is at H-level. In this state, D-MES transistors J2 and J4 are off, and D-MES transistors J1 and J3 are on. The radio-frequency component on signal line Sa is discharged to ground node gnd through D-MES transistor J1 and capacitance element C1, and the transmission signal component is transferred to transmission/reception node Wa through signal line Sc so that interference between the transmission signal and the reception signal is prevented. The reception signal applied to transmission/reception node Wa has a smaller power than transmission signal TX, so that may be amplified by the low noise amplifier shown in FIG. 1 (although the reception signal may have a high power at a position near the transmission source). In this state, even if the radio-frequency component leaks through the gates of D-MES transistors J1–J4 to signal lines SL1 and SL2, the radio-frequency leakage component is absorbed by low pass filters 3a and 3b so that, in the receiving operation, control voltages VT and VR are stably held at the constant voltage level similar to the transmitting operation, and an accurate receiving operation is ensured.

For high-density integration, low pass filters 3a and 3b are not implemented using coils such as choke coils dedicated to radio-frequency cut-off, and are formed of the circuits including resistance elements R and capacitance elements C, whereby low pass filters 3a and 3b do not occupy a large area, and does not impede high-density integration.

[Modification 1]

Figure 8A:
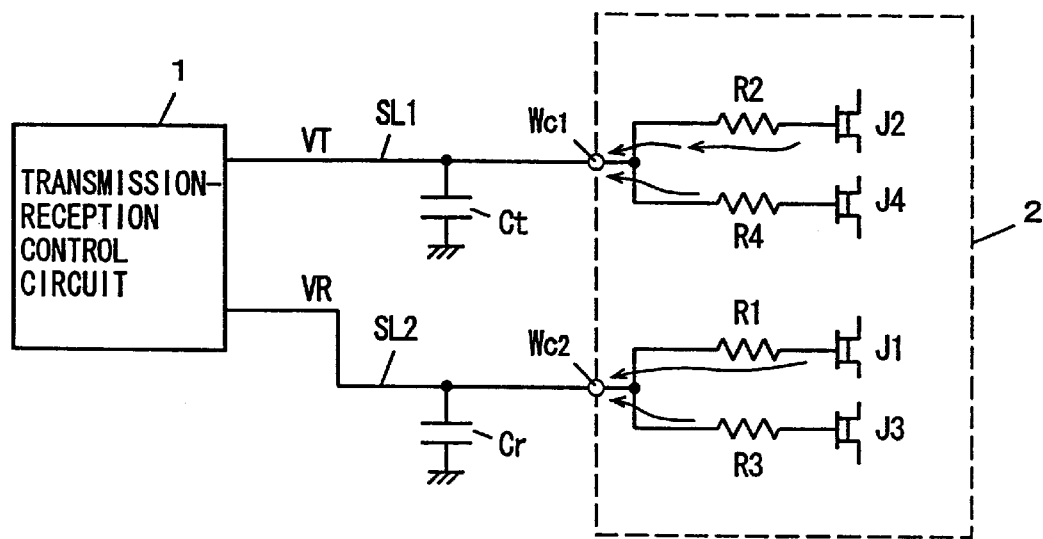
FIGS. 8A–8C show a first modification of the embodiment 1 of the invention.
Figure 8B:
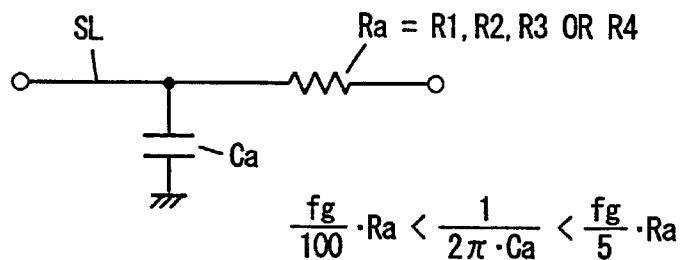

FIG. 8A shows a structure of a first modification of the embodiment 1 of the invention. In FIG. 8A, capacitance elements Ct and Cr are arranged for signal lines SL1 and SL2 in parallel with them, respectively. In transmission/reception multiplexing switch 2, gates of D-MESFETs J1–J4 are connected to resistance elements R1–R4, respectively. Resistance elements R2 and R4 are connected to signal line SL1, and resistance elements R1 and R3 are connected to signal line SR2. Resistance elements R1–R4 are used as resistance components of the low pass filters. More specifically, as shown in FIG. 8B, capacitance Ca (Ct or Cr) is arranged between each signal line SL (SL1 or SL2) and ground node gnd, and resistance element R2 or R4, or resistance element R1 or R3 is used for resistance element Ra. When viewed from the gate of MES transistor J2, the resistance value of resistance element R4 is significantly larger than that of transmission line SL1 and can be ignored, and the converse also holds.

It is necessary to provide only capacitance elements Ct and Cr as the low pass filters, and additional resistance elements are not required so that the area occupied by the low pass filters can be made small.

In the low pass filter using the RC circuit, the cut-off frequency fc is expressed by the following formula:

$$fc=1/(2\cdot\pi\cdot Ca\cdot Ra)$$

The resistance value of resistance element Ra and the capacitance value of capacitance element Ca are so determined as to satisfy the relationship expressed by the following inequalities:

$$\tfrac{1}{2}\cdot\pi\cdot Ca<fg\cdot Rg/5;\ fc<fg/5$$

Thus, cut-off frequency fc of the low pass filter is restricted to be lower than ⅕ times operation frequency fg. Operation frequency fg is the frequency band of the transmission signal TX and reception signal RX, and is e.g., 1.9 GHz. In receivers such as a portable telephone, the power spectrum is concentrated on and around the band of carrier wave (operation) frequency fg.

Figure 8C:
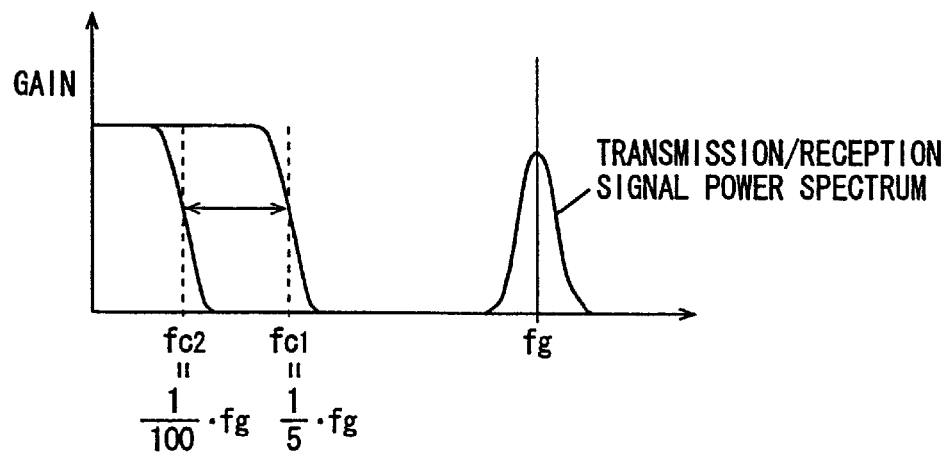

As shown in FIG. 8C, resistance values Ra of resistance elements R1–R4 as well as capacitance values Ca of capacitance elements Ct and Cr are determined to satisfy the relationship expressed by the above inequalities, whereby the radio-frequency leakage component can be reliably cut off. In this case, capacitance values Ca of capacitance elements Ct and Cr may be relatively small, and therefore the area occupied by the capacitance elements can be reduced. By employing the low pass filters with cut-off frequencies fc (=fc1) is smaller than ⅕ times operation frequencies (carrier wave frequency band) fg, the radio-frequency signals can be reliably passed through low pass filters even when transmission/reception control circuit 1 performs fast switching between control voltages VT and VR. Therefore, D-MESFETs J1–J4 can perform the switching operation so that the communications can be performed in a time-division manner by performing fast switching between the transmission and reception.

In this case, resistance values Ra of resistance elements R1–R4 and capacitance values Ca of capacitance elements Ct and Cr are determined to satisfy the following relationship:

$$fg\cdot Ra/100<\tfrac{1}{2}\cdot\pi\cdot Ca<fg\cdot Ra/5$$

Thereby, it is not necessary to increase excessively capacitance values of capacitance elements Ct and Cr for the low pass filters, and therefore the area occupied by the capacitance elements can be reduced. In this case, even if transmission/reception control circuit 1 performs switching between control voltages VT and VR at a high speed, cut-off frequency fc2 shown in FIG. 8C allows passing of the signal in a band from a few nanoseconds to hundreds of nanoseconds so that fast operation can be sufficiently achieved.

[Modification 2]

Figure 9A:
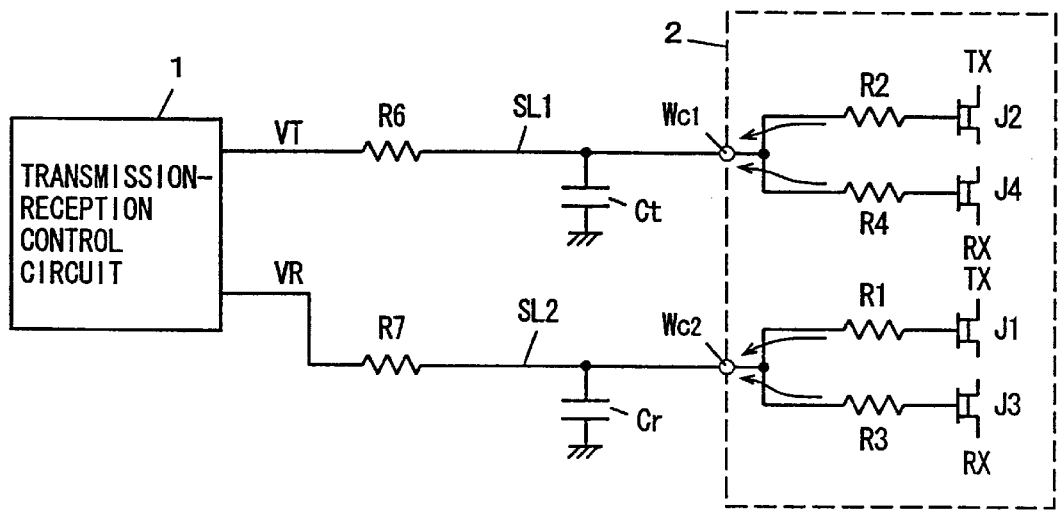
FIGS. 9A and 9B show a second modification of the embodiment 1 of the invention.

FIG. 9A shows a structure according to a second modification of the embodiment 1 of the invention. In the structure shown in FIG. 9A, a resistance element R6 is arranged between capacitance element Ct and the control voltage output node of transmission/reception control circuit 1, and a resistance element R7 is arranged on signal line SL2 between transmission/reception control circuit 1 and capacitance element Cr. Structures other than the above are the same as those shown in FIG. 8A, and corresponding portions bear the same reference numerals.

Figure 9B:
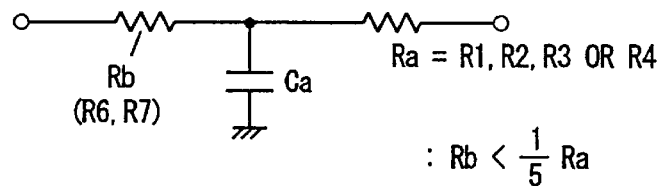

In the structure shown in FIG. 9A, a T-shaped low pass filter is arranged as shown in FIG. 9B that is an equivalent circuit diagram of the structure. In this structure, the impedance of resistance element Rb viewed from capacitor Ca can be higher than that in the structure of FIGS. 8A and 8B so that a filtering performance of the low pass filter formed of resistance element Rb and capacitor Ca can be improved. Therefore, a filtering performance similar to that in the structure of FIGS. 8A and 8B can be achieved even when the capacitance value of capacitor Ca is set to a smaller value. Accordingly, the area occupied by the capacitor can be reduced. Resistance elements R6 and R7 are made of diffusion resistances, which are formed by implanting dopant impurities into impurity regions at the surface of GaAs substrate, and the required resistance values can be achieved with small occupied areas. Meanwhile, the capacitance elements are implemented by forming parallel electrode layers on the surface of the substrate.

Although resistance elements R6 and R7 are employed, the area occupied by the capacitance elements can be reduced more than the increase by resistance elements R6 and R7. Consequently, the area occupied by the low pass filters can be reduced.

The resistance values of resistance elements Ra and Rb are so determined as to satisfy the following relationship:

$$Rb < Ra/5$$

The radio-frequency leakage component flows from transmission/reception multiplexing switch 2 toward transmission/reception control circuit 1 through signal lines SL1 and SL2. It can be considered that the T-shaped structure of the low pass filter is equivalent to the structure including two cascaded low pass filters. Accordingly, by employing resistance element Ra larger in resistance value than resistance element Rb, the leakage component can be sufficiently blocked owing to the transmission parameter $(1+j \cdot \omega \cdot Ca \cdot Ra)$ of the RC low pass filter formed of resistance element Ra and capacitance element Ca. Therefore, even if the resistance value of resistance element Rb is small, the radio-frequency leakage component can be sufficiently absorbed at a portion near the transmission path thereof.

The resistance value of resistance element Rb can be small, and the area occupied by resistance element Rb can be reduced (i.e., the required resistance value can be achieved with a small diffusion region). Also, the area occupied by capacitance element Ca can be reduced, and the low pass filter occupying a small area can be achieved.

[Modification 3]

Figure 10:
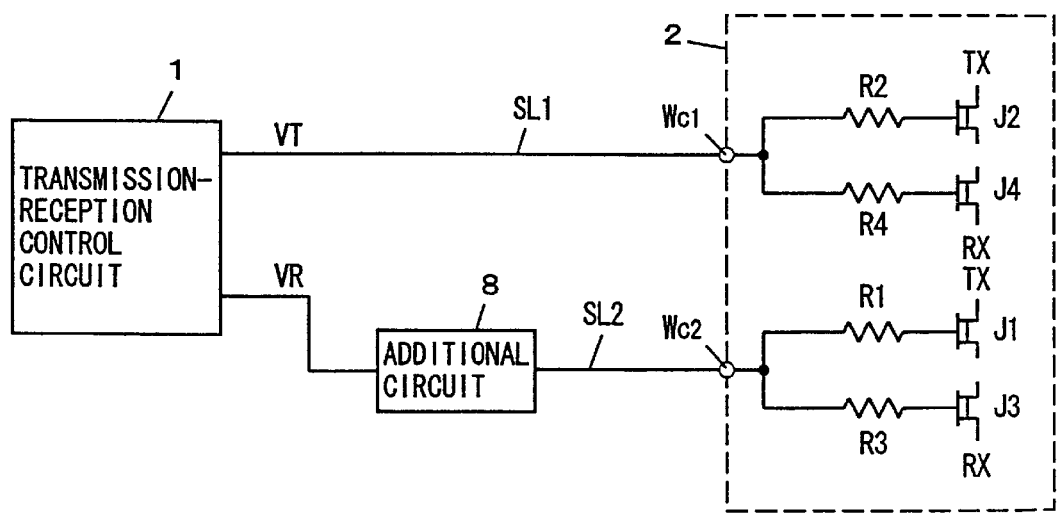
FIG. 10 shows a third modification of the embodiment 1 of the invention.

FIG. 10 shows a structure according to a third modification of the embodiment 1 of the invention. In the structure shown in FIG. 10, an additional circuit 8 for blocking the radio-frequency leakage component is arranged for signal line SL1 transmitting reception control voltage VR. Additional circuit 8 may be the low pass filter (LPF) shown in FIG. 7, or may be simply the capacitance element shown in FIG. 8A. Also, it may be a combination of capacitance element Cr and resistance element R7 shown in FIG. 9A.

Reception control voltage VR is applied from control voltage input node Wc2 through resistance elements R1 and R3 to the gates of D-MES transistors J1 and J3 which are turned off in the transmission mode, respectively. In the transmission mode, D-MES transistors J1 and J3 must be reliably off. If D-MES transistors J1 and J3 were weakly on, transmission signal TX would be discharged to the ground potential level through D-MES transistor J1, and would also be discharged to the ground potential level through D-MES transistor J3 and D-MES transistor J4 that is on in the transmission mode, resulting in a large loss of the transmission signal. For improving the withstand power characteristics in the transmission mode, it is particularly necessary that D-MES transistors J1 and J3, which are to be off in the transmission operation, accurately receive the voltages at L-level at the respective gates and thereby are reliably kept off.

Owing to provision of additional circuit 8 on reception control voltage transmission line SL2 as shown in FIG. 10, additional circuit 8 can block the radio-frequency leakage component even if it flows to signal line SL2 through D-MES transistors J1 and J3 which are to be off in the transmission mode. Thereby, D-MES transistors J1 and J3 can be reliably kept off so that discharging of transmission signal TX through transistors J1 and J3 can be prevented. At this time, transmission signal TX may partially leak to signal line SL1 through D-MES transistors J2 and J4. Even in this case, D-MES transistors J2 and J4 are in the depletion mode and are in the strong on state. Therefore, an influence which is exerted on the loss of transmission signal TX by D-MES transistors J2 and J4 is smaller than that by the discharging of transmission signal TX through D-MES transistors J1 and J3.

Accordingly, an effect similar to that of the foregoing embodiment shown in FIG. 7 can be achieved by provision of additional circuit 8 for blocking the radio-frequency component on the signal line SL2 transmitting reception control voltage VR.

[Modification 4]

Figure 11:
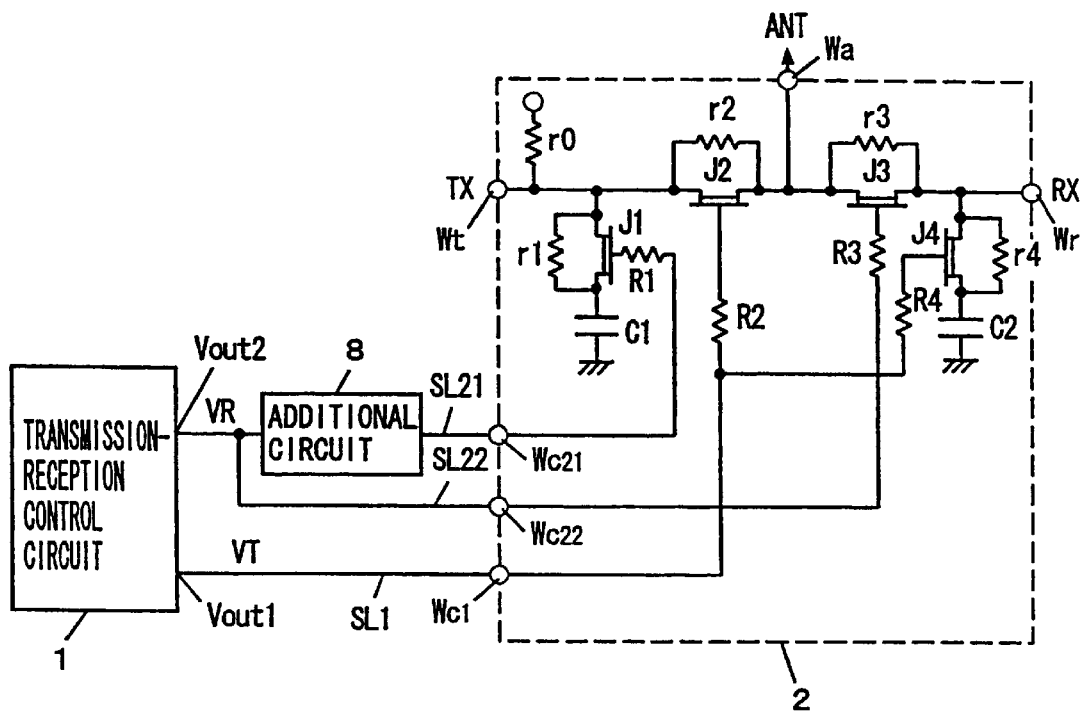
FIG. 11 shows a fourth modification of the embodiment 1 of the invention.

FIG. 11 shows a structure according to a fourth modification of the embodiment 1 of the invention. The signal line for transmitting reception control voltage VR is divided into a signal line SL21 which transmits control voltage VR to the gate of D-MES transistor J1 of transmission/reception multiplexing switch 2, and a signal line SL22 which transmits control voltage VR to the gate of D-MES transistor J3. Signal lines SL21 and SL22 are coupled to control voltage input nodes Wc21 and Wc22 of transmission/reception multiplexing switch 2, respectively. Transmission control voltage VT is coupled to control voltage input node Wc1 of transmission/reception multiplexing switch 2 through signal line SL1. Control voltage input node Wc1 is coupled to the gates of D-MES transistors J2 and J4 through resistance elements R2 and R4, respectively.

Additional circuit 8 is provided only for signal line SL21. Additional circuit 8 has the structure in any one of the foregoing embodiments.

In the transmission mode, when D-MES transistor J1 is turned on, transmission signal TX is discharged to the ground potential level through D-MES transistor J1 and capacitance element C1 to increase the loss of the transmission signal TX so that the transmission signal of a high power cannot be transferred to antenna ANT. Thus, it is D-MES transistor J1 that exerts the largest influence on the loss of the transmission signal TX. Transmission signal TX is also transferred to D-MES transistor J3. When viewed from D-MES transistor J2, however, the impedance with respect to transmission/reception input node Wa is much smaller than the impedance with respect to D-MES transistor J3. Therefore, a major part of transmission signal TX transferred from D-MES transistor J2 is transferred to antenna ANT through transmission/reception node Wa.

When viewed from transmission signal input node Wt, if the gate potential of D-MES transistor J1 may rise and the impedance of D-MES transistor J1 may decrease, the signal transmission path including D-MES transistor J1 cannot be ignored with respect to the signal transmission path including D-MES transistor J2. Therefore, transmission signal TX is discharged through D-MES transistor J1 and capacitance element C1, resulting in a large power loss of transmission signal TX. In this transmission mode, therefore, it is D-MES transistor J1 that exerts the largest influence on the loss of transmission signal TX. Owing to provision of additional circuit 8 for signal line SL21 transmitting control voltage VR for D-MES transistor J1, D-MES transistor J1 can have the gate voltage kept constant in a DC manner, and can reliably maintain the off state even when the radio-frequency leakage occurs in D-MES transistor J1. Thereby, the loss of transmission signal TX is prevented. Accordingly, transmission signal TX of high power can be transmitted without an increased large transmission loss, and lowering of the withstand power characteristics can be prevented similarly to the foregoing structures of the embodiment.

According to the embodiment 1 of the invention, as described above, in the RF front end portion including transmission/reception control circuit 1 and transmission/reception multiplexing switch 2 integrated on the same substrate, the low pass filter for absorbing the radio-frequency leakage component is arranged at the control voltage transmission path between the transmission/reception control circuit 1 and the transmission/reception multiplexing switch 2. Even if the radio-frequency leakage component occurs, therefore, it is possible to suppress an influence, which may be exerted on the control voltage level by the radio-frequency leakage component, and the control voltage which is at the constant voltage level can be transmitted to transmission/reception multiplexing switch 2. Thus, without an influence by the radio-frequency leakage component, the transistor to be off can be reliably kept off, and the transistor to be on can be reliably kept on. Accordingly, lowering of the handling power characteristics can be prevented.

For blocking the radio-frequency leakage component, the resistance elements and the capacitance elements are used, and no coil is used. Therefore, it is possible to provide a filter for absorbing the radio-frequency leakage component with a reduced occupying area. Further, by blocking the radio-frequency leakage component, it is not necessary to increase the gate widths of the MES transistors which are the components of transmission/reception control circuit 1 so that the occupying area and current consumption of the transmission/reception control circuit 1 can be reduced.

[Embodiment 2]

Figure 12A:
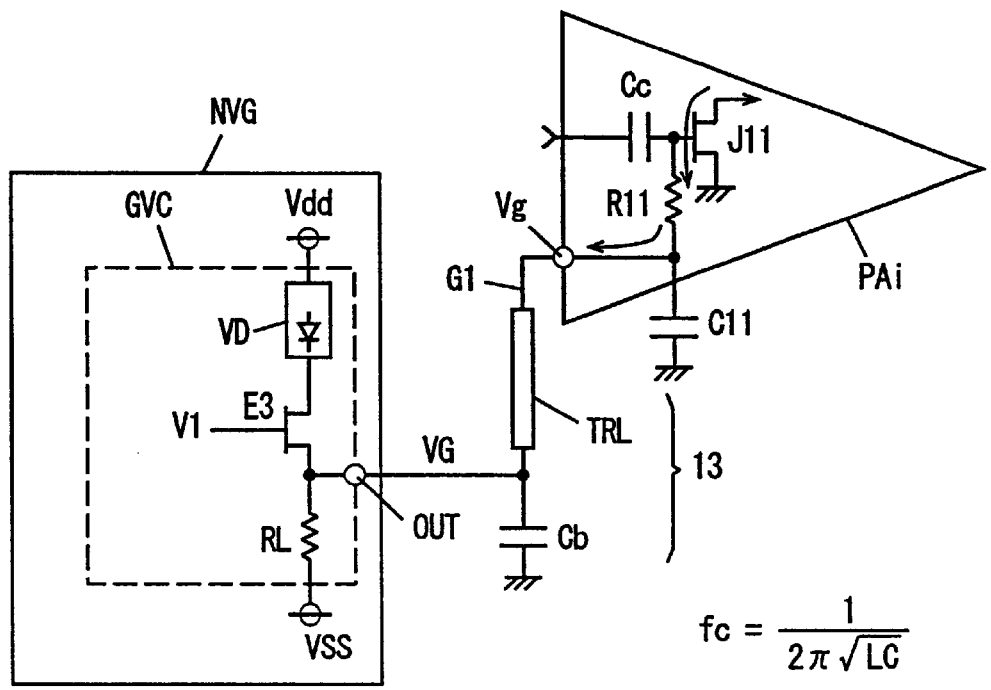
FIGS. 12A–12C schematically show a structure of a radio-frequency integrated circuit according to an embodiment 2 of the invention.

FIG. 12A shows a structure of a radio-frequency integrated circuit of an embodiment 2 of the invention. In FIG. 12A, a low pass filter 13 is arranged between gate voltage output node OUT of gate voltage control circuit GVC included in negative voltage generating circuit NVG and control voltage input node Vg of power amplifier circuit PAi, i.e., the radio-frequency circuit. Power amplifier circuit PAi has the same structure as the power amplifier circuit shown in FIG. 5, and control voltage input node Vg thereof is supplied with control voltage VG, which determines the level of the gate voltage of E-MES transistor J11 provided for amplification. Power amplifier circuit PAi may be any one of three power amplifier circuits PAa–PAc of power amplifier PA.

Figure 5:
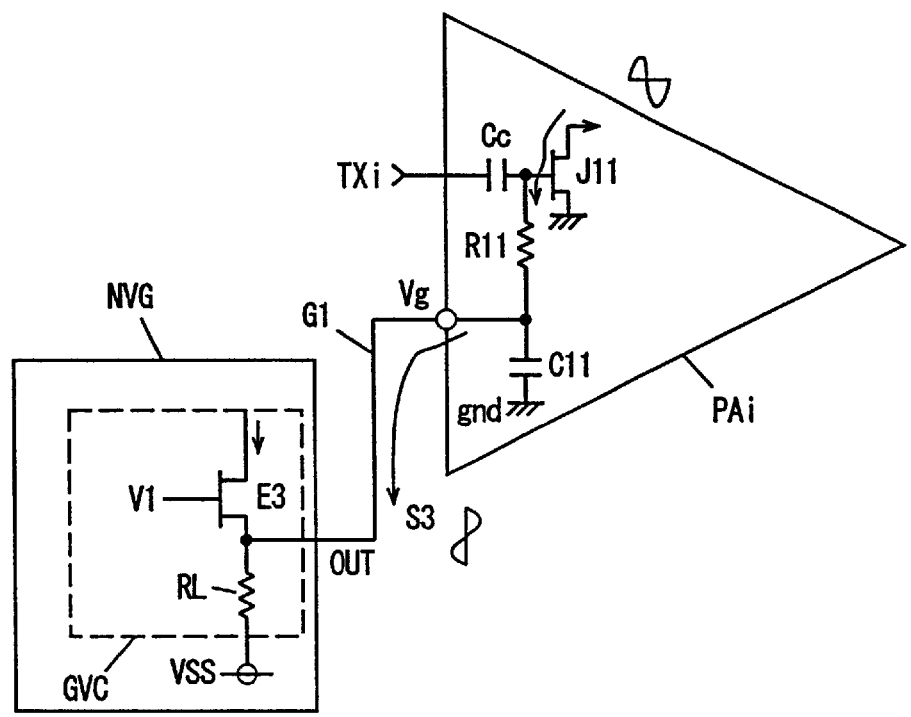
FIG. 5 schematically shows a structure of a connection between a power amplifier and a negative voltage generating circuit shown in FIGS. 1 and 2.

Gate voltage control circuit GVC has the same structure as that shown in FIG. 5. In FIG. 12A, gate voltage control circuit GVC includes voltage down circuit VD provided between an E-MES transistor E3 and positive power supply voltage Vdd. Voltage down circuit VD is provided for applying a voltage, which is lower than control voltage V1 applied to the gate of E-MES transistor E3, to the drain of E-MES transistor E3. This is because the reverse bias state between the gate and drain must be maintained for operation of the MESFET. Reference voltage V1 for control is produced as disclosed in the foregoing prior art reference. More specifically, a constant current is generated by a current mirror circuit, and reference voltage V1 is generated by adjusting a current through the resistance element with this constant current. This constant current generating portion includes a diode for shifting the voltage level of control reference voltage V1 to a negative voltage level. Control voltage VG generated at output node OUT is a negative voltage. For example, negative voltage VSS is about −1.8 V, and control voltage VG is about −1.3 V.

Low pass filter 13 includes a transmission line TRL arranged in signal line G1 between output node OUT and input node VG, and capacitance element Cb arranged between signal line G1 and the ground node. Owing to provision of low pass filter 13 in signal transmission line G1 of control voltage VG, the radio-frequency leakage component can be reliably blocked. More specifically, even if capacitance element C11 may not block the radio-frequency signal applied through capacitance element Cc or the radio-frequency component leaking through the gate of E-MES transistor J11 during the power amplification operation, low pass filter 13 can reliably block such radio-frequency leakage component. Therefore, control voltage VG can be held constant. Accordingly, it is possible to prevent generation of reflected wave due to the radio-frequency leakage component on the output node OUT, and therefore variations in control voltage VG can be prevented so that unstable operation of circuit GVC can be prevented, and the bias point of E-MES transistor J11 can be stably held at the constant level.

Figure 12B:
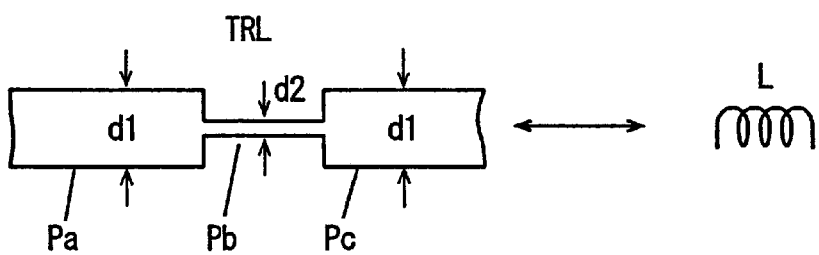

FIG. 12B shows a structure of transmission line TRL shown in FIG. 12A. In FIG. 12B, transmission line TRL has a portion Pb having a smaller line width than portions Pa and Pc on the opposite sides thereof. For example, if line portions Pa and Pc of transmission line TRL have a line width d1 of 100 $\mu$m, line portion Pb has a line width d2 of, e.g., 20 $\mu$m. In transmission line TRL having the narrow portion, the narrow portion Pb suppresses passing of the radio-frequency component, and therefore equivalently provides an inductance L as shown in FIG. 12B.

Figure 12C:
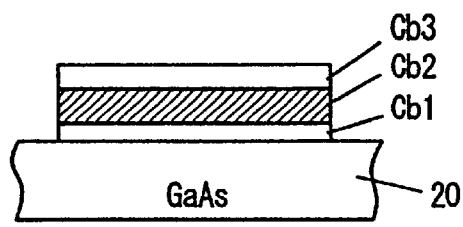

FIG. 12C shows a structure of capacitance element Cb. Capacitance element Cb is formed of a metal interconnection layer Cb1 of a low resistance on a GaAs substrate 20, an insulating layer Cb2 on metal interconnection layer Cb1 and a metal interconnection layer Cb3 on insulating layer Cb2. Capacitance element Cb is a parallel-electrode MIM capacitor.

As shown in FIG. 12B, the inductance component is implemented by utilizing transmission line TRL. Therefore, the low pass filter can be implemented in a small occupying area without adding an element such as a coil. Assuming that transmission line TRL has an inductance of L, cut-off frequency of low pass filter 13 is given by the following formula:

$$fc=½·\pi·(L·C)^{1/2}$$

A relationship of (fc<fg/5) may be satisfied.

In the structure shown in FIG. 12A, power amplifier circuit PAi and gate voltage control circuit GVC for controlling the gain of this amplifier are integrated on the same substrate. In this structure, the low pass filter is arranged in the signal line for transmitting the gate voltage, whereby the radio-frequency leakage component can be reliably restrained without increasing the occupied area so that the gate voltage control circuit can operate stably, and constant gate voltage VC can be produced stably.

[Modification]

Figure 13A:
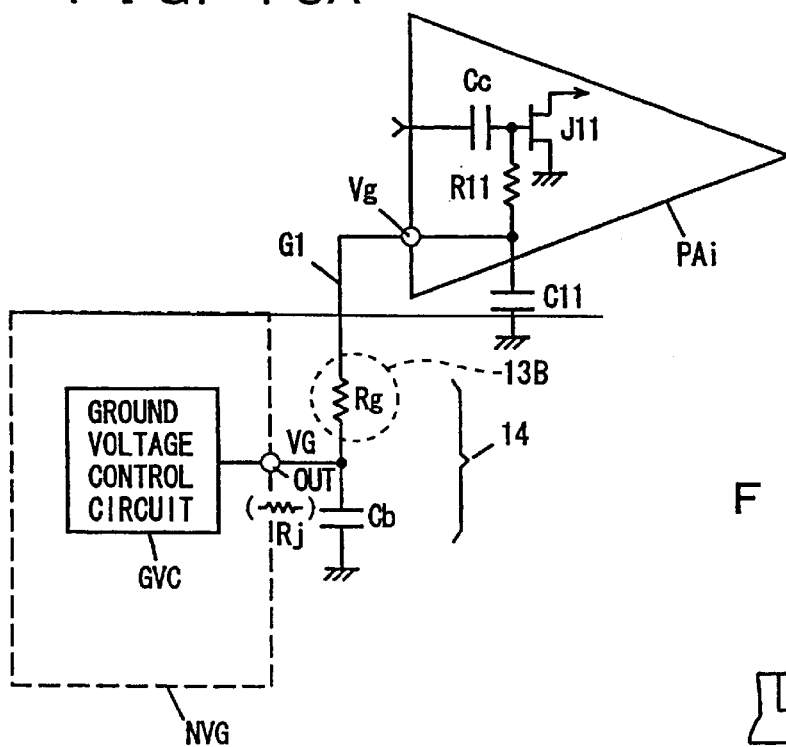
FIGS. 13A and 13B show a modification of the embodiment 2 of the invention.
Figure 13B:
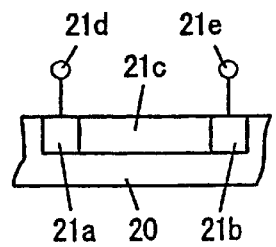

FIG. 13A, shows a structure according to a modification of the embodiment 2 of the invention. In the structure shown in FIG. 13A, a resistance element Rg is arranged in signal line G1 between control voltage output node OUT of gate voltage control circuit GVC and gate voltage input node Vg of power amplifier circuit PAi. In the structure shown in FIG. 13A therefore, a low pass filter 14 include resistance element Rg and capacitance element Cb. Resistance element Rg include of an impurity diffusion region 21c located between heavily doped impurity regions 21a and 21b in GaAs substrate 20, as show in FIG. 13B. Nodes 21d and 21e connected to heavily doped impurity regions 21a and 21b provide ends of resistance element Rg, respectively.

By using the diffusion resistance as resistance element Rg, the required resistance value can be achieved in a small occupied area. This is because GaAs substrate 20 is a semi-insulating substrate, and has an extremely high resistance value so that the required resistance value can be achieved easily in a small occupied area.

In the structure shown in FIG. 13A, cut-off frequency fc is given by 1/(2·π·Rg·Cb) similarly to the foregoing embodiment 1. The relationship of (fc<fg/5) may be satisfied.

According to the structure in which low pass filter 14 is formed of resistance element Rg and capacitance element Cb as described above, the radio-frequency leakage component leaking from power amplifier circuit PAi can be easily blocked with a small occupied area, and the gate voltage control circuit GVC can stably operate. Resistance element Rj may be added to output node OUT.

The low pass filter or the additional circuit of the embodiment 1 may be employed as the low pass filter of the embodiment 2, and the converse also holds.

According to the radio-frequency integrated circuit of the invention, as described above, the radio-frequency processing circuit and the control circuit controlling the operation of the radio-frequency processing circuit are integrated on the same chip, and particularly the low pass filter blocking the radio-frequency component is arranged between the radio-frequency processing circuit and the control circuit. Therefore, the radio-frequency processing circuit can operate stably without influence of the radio-frequency leakage component.

Particularly in the transceiver such as a compact portable telephone, the low pass filter blocking the radio-frequency component is arranged between the transmission/reception multiplexing switch and the control circuit controlling the operation modes of the transmission/reception multiplexing switch, whereby it is possible to suppress lowering of the handling power characteristics of the transmission/reception multiplexing switch as well as, increase in power consumption of the control circuit.

Further, in the structure wherein the power amplifier performing the power amplification of the transmission signal and the negative voltage generating circuit controlling the gain of this power amplifier are arranged on the same chip, the gate voltage control circuit, which is included in the negative voltage generating circuit for controlling the gate voltage of the MESFET for amplification, can operate stably without influence of the radio-frequency leakage component.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A radio-frequency integrated circuit comprising:
 a substrate;
 a radio-frequency processing circuit including
   a first field effect transistor, receiving a radio-frequency input signal within a frequency band, and transferring a signal corresponding to the radio-frequency input signal, and
   a transmission/reception multiplexing switch having a transmission mode for transferring from a transmission signal input node the signal corresponding to the radio-frequency input signal to a transmission/reception node, coupled to an antenna, via a second field effect transistor, and a reception node for transferring a radio-frequency signal applied to said transmission/reception node from the antenna to a reception signal output node via a third field effect transistor;
 a control voltage generating circuit applying an operation control voltage to a gate of said first field effect transistor through a control voltage path different from a transmission path of the radio-frequency input signal and including a transmission/reception control circuit for applying a control voltage for turning on and off the second and third field effect transistors in accordance with an operation mode, said radio-frequency processing circuit and said control voltage generating circuit being integrated on said substrate; and
 a low pass filter for removing a signal in the frequency band of the radio-frequency input signal and connected in the control voltage path.

2. The radio-frequency integrated circuit according to claim 1, wherein
 said radio-frequency processing circuit includes a power amplifier amplifying the radio-frequency input signal in said first field effect transistor, and
 said control voltage generating circuit includes a gate voltage control circuit applying a bias voltage to said gate of said first field effect transistor for determining gain of said power amplifier.

3. The radio-frequency integrated circuit according to claim 2, wherein said power amplifier includes said first field effect transistor, said first field effect transistor having a gate, a resistance element connected between the gate of said first field effect transistor and a bias voltage input node, and a capacitance element connected between said bias voltage input node and a reference voltage source line, said bias voltage input node being connected to said low pass filter.

4. The radio-frequency integrated circuit according to claim 1, including an RF front end integrated circuit comprising said radio-frequency processing circuit, said control voltage generating circuit, and said low pass filter, for processing a signal in a frequency band of a carrier wave of transmission and reception signals for a portable telephone.

5. A radio-frequency integrated circuit including
a semiconductor chip;
a transmission/reception multiplexing switch circuit having a transmission signal input node, a reception signal output node, and a control signal input node separate from said transmission signal input node and said reception signal output node, and operating in accordance with a control signal applied to said control signal input node in either a transmission mode for transmitting a transmission signal applied to said transmission signal input node or a reception mode for receiving and sending an incoming signal to said reception signal output node;
a control circuit generating the control signal applied to the control signal input node of said transmission/reception multiplexing switch circuit in response to an operation mode instructing signal, said transmission/reception multiplexing switch circuit and said control circuit being integrated on said semiconductor chip; and
a low pass filter passing a signal in a band lower than a frequency band of the transmission signal applied to said transmission signal input node connected between said control circuit and said control signal input node of said transmission/reception multiplexing switch circuit.

6. The radio-frequency integrated circuit according to claim 5, wherein
said transmission/reception multiplexing switch circuit includes a switch element receiving the control signal on said control signal input node through a resistance element coupling one of said transmission signal input node and reception signal output node to a transmission/reception node electrically coupled to an antenna, and
said low pass filter includes a capacitance element connected between a reference potential source and an interconnection line between a control signal output node of said control circuit and said resistance element, said resistance element functioning as a component of said low pass filter.

7. The radio-frequency integrated circuit according to claim 6, wherein
said control circuit includes means for generating a first control signal in a transmission mode and a second control signal in a reception mode;
said switch element includes
a first switching transistor turned on to couple said transmission signal input node to said transmission/reception node when the first control signal is generated,
a second switching transistor turned on to couple said transmission signal input node to a reference potential source when the second control signal is generated,
a third switching transistor turned on to transmit the signal on said transmission/reception node to said reception signal output node when the second control signal is generated, and
a fourth switching transistor turned on to transfer the signal on said reception signal output node to said reference potential source when the first control signal is generated; and said low pass filter is arranged only in a transmission path transmitting the second control signal to a control electrode node of said second switching transistor.

8. The radio-frequency integrated circuit according to claim 6, wherein said capacitance element has a capacitance Ca, said resistance element has a resistance Ra, and $$1/(2 \cdot \pi \cdot Ca) < (fg \cdot Ra/5),$$

where fg represents a frequency of the transmission signal applied to said transmission signal input node.

9. The radio-frequency integrated circuit according to claim 6, wherein said capacitance element has a capacitance Ca, said resistance element has a resistance Ra, and $$fg \cdot Ra/100 < 1/(2 \cdot \pi \cdot Ca) < (fg \cdot Ra/5),$$

where fg represents a frequency of the transmission signal applied to said transmission signal input node.

10. The radio-frequency integrated circuit according to claim 6, wherein said low pass filter further includes a second resistance element in said interconnection line between said control signal output node of said control circuit and a connection node between said capacitance element and said interconnection line.

11. The radio-frequency integrated circuit according to claim 10, wherein said resistance element has a resistance Ra, said additional resistance element has a resistance Rb, and $$Rb < Ra/5.$$

12. The radio-frequency integrated circuit according to claim 6, wherein
said transmission/reception multiplexing switch element includes a second switch element receiving a second control signal through a second resistance element and coupling the other of said transmission signal input node and said reception signal output node to said transmission/reception node electrically coupled to the antenna, said control circuit generating the second control signal, and
said radio-frequency integrated circuit further comprises a second low pass filter including a capacitance element connected between a second control signal output node of said control circuit and said second resistance element, the second control signal being output from said second control signal output node, and said second resistance element functioning as a component of said second low pass filter.

13. The radio-frequency integrated circuit according to claim 6, wherein
said switch element is connected between said reception signal output node and said transmission/reception node and transmits the incoming signal applied to said transmission/reception node to said reception signal output node, and
said transmission/reception multiplexing switch circuit includes a second switch element connected between said transmission signal input node and said transmission/reception node, receiving a second control signal through a second resistance element, and transmits the transmission signal applied to said transmission signal input node to said transmission/reception node, whereby said control circuit generates a second control signal.

14. The radio-frequency integrated circuit according to claim 5, further comprising:

an amplifier for amplifying and transmitting a radio-frequency signal to said transmission signal input node;

bias voltage generator for generating a bias voltage controlling gain of said amplifier; and a second low pass filter connected between a bias voltage output node of said bias voltage generator and a bias voltage input node of said amplifier.

15. The radio-frequency integrated circuit according to claim 14, wherein the second low pass filter includes:

a transmission line connected between said bias voltage output node and said bias voltage input node for transmitting said bias voltage, and having a first portion smaller in width than a second portion; and a capacitance element connected between said bias voltage output node and a reference potential source.

16. The radio-frequency integrated circuit according to claim 14, wherein said second low pass filter includes:

a resistance element connected between said bias voltage output node and said bias voltage input node; and a capacitance element connected between said bias voltage output node and a reference potential source.

17. A radio-frequency integrated circuit including:

a substrate;

an amplifier having a bias voltage input node and amplifying a radio-frequency signal;

a bias voltage generating circuit generating a bias voltage for controlling gain of said amplifier and applied to said bias voltage input node of said amplifier, said amplifier and said bias voltage generating circuit being integrated on said substrate; and a low pass filter connected between said bias voltage input node of said amplifier and a bias voltage output node of said bias voltage generating circuit, said low pass filter including a transmission line connected between said bias voltage output node of said bias voltage generating circuit and said bias voltage input node of said amplifier for transmitting the bias voltage, said transmission line having first and second portions with different, respective widths, and a capacitance element connected between said bias voltage output node and a reference potential source.

18. The radio-frequency integrated circuit according to claim 17, wherein said amplifier includes a field effect transistor having a control gate node and amplifying the radio-frequency signal received on said control gate node, wherein the bias voltage generated by said bias voltage generating circuit is a negative voltage applied to said control gate node of said field effect transistor.

19. The radio-frequency integrated circuit according to claim 17, wherein said amplifier includes a field effect transistor having a gate receiving the radio-frequency signal, a resistance element connected between the gate of said field effect transistor and said bias voltage input node, and a capacitance element connected between said bias voltage input node and a reference voltage source.

20. A radio-frequency integrated circuit including:

a substrate;

an amplifier having a bias voltage input node and amplifying a radio-frequency signal;

a bias voltage generating circuit generating a bias voltage for control gain of said amplifier and applied to said bias voltage input node of said amplifier, said amplifier and said bias voltage generating circuit being integrated on said substrate; and a low pass filter connected between said bias voltage input node of said amplifier and a bias voltage output node of said bias voltage generating circuit, said low pass filter including:

a resistance element connected between said bias voltage output node of said bias voltage generating circuit and said bias voltage input node of said amplifier; and a capacitance element connected between said bias voltage output node and a reference potential source.

21. The radio-frequency integrated circuit according to claim 20, wherein said amplifier includes a field effect transistor having a gate receiving the radio-frequency signal, a resistance element connected between the gate of said field effect transistor and said bias voltage input node, and a capacitance element connected between said bias voltage input node and a reference voltage source.

* * * * *